(12) United States Patent
Yu et al.

(10) Patent No.: US 7,352,010 B2
(45) Date of Patent: Apr. 1, 2008

(54) PHOTOELECTRIC CONVERSION MODULE WITH COOLING FUNCTION

(75) Inventors: Juhyun Yu, Hitachi (JP); Yoshiaki Ishigami, Hitachi (JP); Yoshinori Sunaga, Hitachinaka (JP); Akihiro Hiruta, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 479 days.

(21) Appl. No.: 11/032,171

(22) Filed: Jan. 11, 2005

(65) Prior Publication Data

US 2005/0207459 A1    Sep. 22, 2005

(30) Foreign Application Priority Data

Mar. 19, 2004    (JP) .............................. 2004-079557
May 14, 2004    (JP) .............................. 2004-144823

(51) Int. Cl.
  H01L 29/22    (2006.01)
  H01L 33/00    (2006.01)
  H01L 23/02    (2006.01)
(52) U.S. Cl. .......................... 257/99; 257/81; 257/82; 257/100; 257/116; 257/678; 257/E33.058; 257/E25.032
(58) Field of Classification Search ................. 372/36, 372/75; 257/81, 82, 91, 99, 100, 116, 117, 257/432–437, 749, E23.001–E23.194, E33.056–E33.059, 257/E25.032
See application file for complete search history.

(56) References Cited

U.S. PATENT DOCUMENTS

| | | | | |
|---|---|---|---|---|
| 5,814,871 A | * | 9/1998 | Furukawa et al. | 257/433 |
| 5,872,803 A | * | 2/1999 | Mori et al. | 372/75 |
| 7,158,550 B2 | * | 1/2007 | Keh et al. | 372/36 |
| 2004/0195580 A1 | * | 10/2004 | Nishizawa et al. | 257/99 |

FOREIGN PATENT DOCUMENTS

JP    2959678 B2    7/1999

* cited by examiner

*Primary Examiner*—Jasmine Clark
(74) *Attorney, Agent, or Firm*—Foley & Lardner LLP

(57) ABSTRACT

A photoelectric conversion module with a cooling function has a semiconductor element to transmit/receive an optical signal, a stem to fix the semiconductor element, a cap to cover the semiconductor element, and a lead to apply an electrical signal to the semiconductor element or to transmit an electrical signal from the semiconductor element, wherein on the stem, there is provided a heat releasing device formed of a peltiert element, and a thermal conduction member for heat absorption and a thermal conduction member for heat release provided respectively on both sides of the peltiert element, and the semiconductor element is directly disposed on the thermal conduction member for heat absorption.

18 Claims, 13 Drawing Sheets

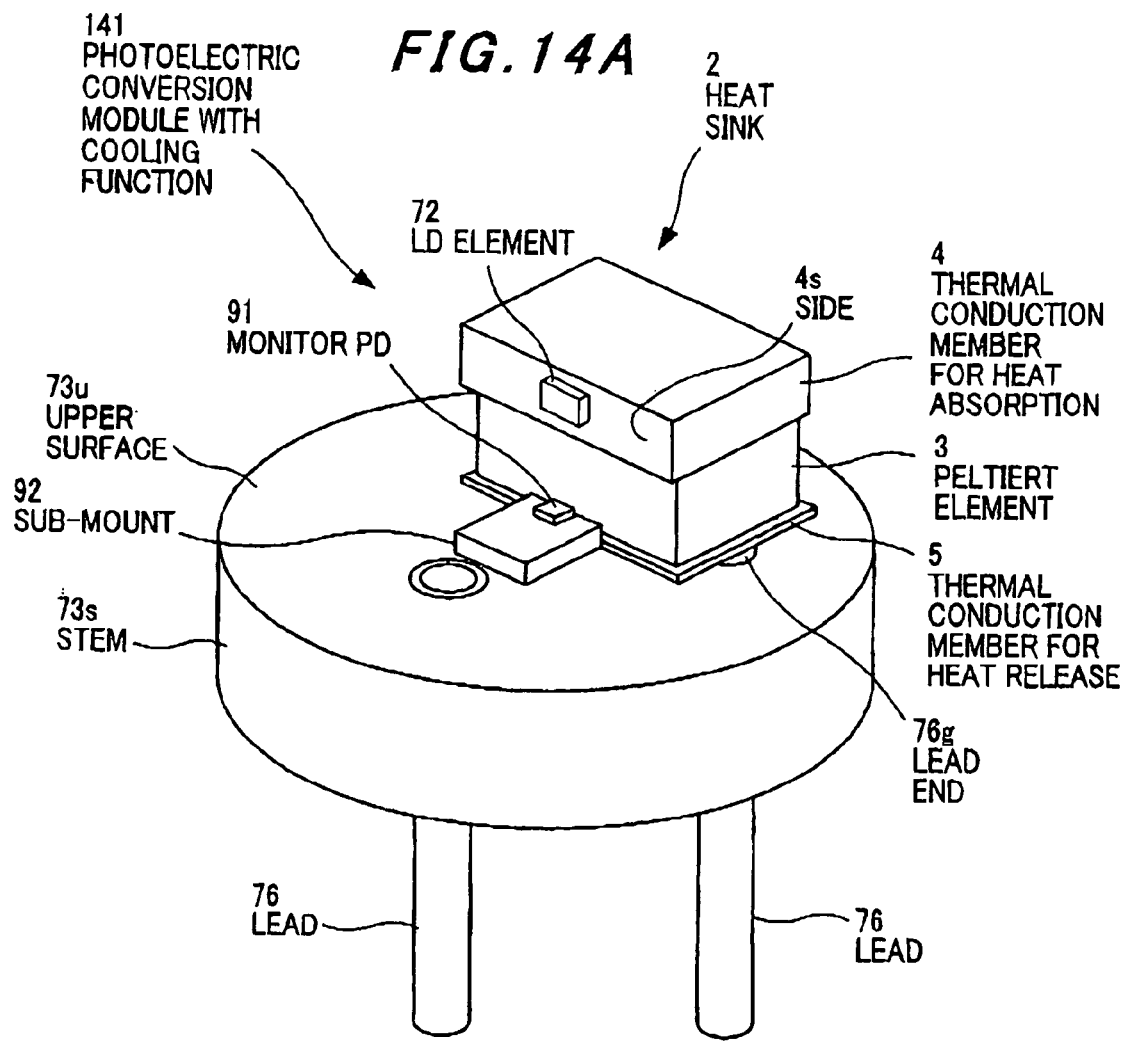
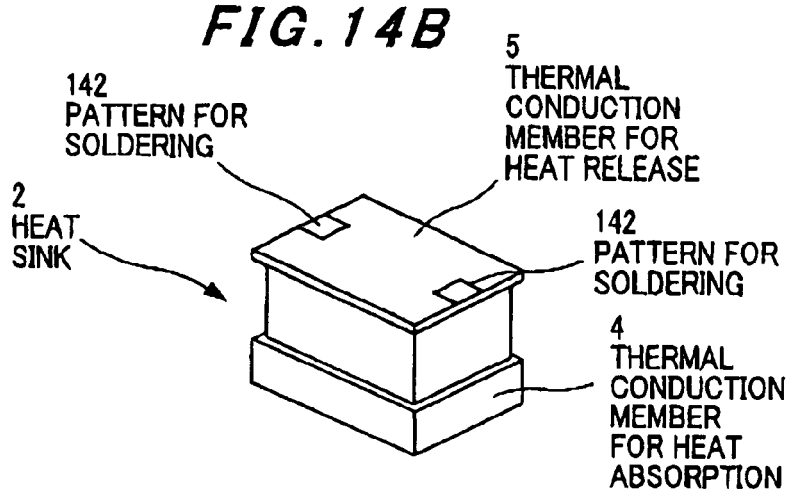

PHOTOELECTRIC CONVERSION MODULE WITH COOLING FUNCTION

The present application is based on Japanese patent application Nos. 2004-079557 and 2004-144823, the entire contents of which are incorporated herein by reference.

BACKGROUND OF THE INVENTION

1. Field of the Invention

The present invention relates to a photoelectric conversion module in which a semiconductor element is provided on a heat releasing device inside a package.

2. The Related Art of the Invention

A semiconductor element generates heat when it consumes power, and consequently the heat causes the characteristic to be deteriorated, an expected performance to get unattainable, or the stability of the element itself and a photoelectric conversion module in which the element is mounted, and further of an electronic device into which the photoelectric conversion module is incorporated to be worsened. For this reason, it is important to release the heat generated to suppress a temperature rise in the element itself and the photoelectric conversion module.

FIG. 1 shows a conventional photoelectric conversion module 171. The conventional photoelectric conversion module 171 fixes a semiconductor laser diode (LD) element 172 on a metal heat sink (column) 174 inside a metal package 173 through a ceramic sub-mount 175.

The package 173 includes a disc-shaped stem 173s, and a cylindrical cap 173c to cover an upper surface of the stem 173s and the LD element 172. In general the package 173 is called "Can package" and used most widely as an inexpensive package of a photoelectric conversion module (LD module) for a container of the LD element 172.

The heat sink 174 is fixed on the stem 173s, and a plurality of leads 176 passing through the stem 173s are installed in the stem 173s. The heat sink 174 may be constructed separately from the stem 173s or formed integrally with the stem 173s. A lens 177 is mounted on an upper portion of the cap 173c to collect a laser beam L from the LD element 172.

A cathode of the LD element 172 is electrically connected to the lead 176 by wire-bonding a gilded electrode 178 formed on the surface of the LD element 172 to the lead 176 with a wire 179.

Further, an anode as a backside of the LD element 172 is soldered to the sub-mount 175 through a gilded electrode 180 formed on the sub-mount 175. The sub-mount 175 to which the LD element 172 is soldered, is fixed to the heat sink 174 with solder.

In case the stem 173s is an anode-type, which is not illustrated in detail, the anode of the LD element 172 is electrically connected to the heat sink 174 by a via hole to penetrate the electrode 180 and the sub-mount 175, or by wire-bonding the electrode 180 to the heat sink 174 with a wire. In the case of a floating-type, the anode of the LD element 172 is electrically connected to a different lead 176 by wire-bonding the electrode 180 to the different lead 176 with a wire.

The LD element 172 is so small that it is not easy to treat and locate it, and thus, as stated above, the LD element 172 is mounted on the sub-mount 175 in advance in order to make the treatment easier, and then the sub-mount 175 gets installed on the heat sink 174.

The photoelectric conversion module 171 suppresses a temperature rise inside the package 173 by transmitting heat generated by the LD element 172 from the sub-mount 175 to the heat sink 174 and further from the heat sink 174 to the stem 173s and the cap 173c to release the heat to the outside of the package 173.

It is noted that Japanese Patent Publication No. 2959678 exists as a technical document relating to the present invention.

However, in such photoelectric conversion module 171, effectiveness of heat release is enhanced by the heat sink 174, but the LD element 172 is not actively forced cooled and thus there is a problem that a temperature rise inside the package 173 is not sufficiently suppressed.

SUMMARY OF THE INVENTION

It is an object of the present invention to provide a compact photoelectric conversion module with a cooling function that is made up of a small number of components.

According to one aspect of the present invention, a photoelectric conversion module with a cooling function comprises:

a semiconductor element to transmit/receive an optical signal;

a stem to fix the semiconductor element;

a cap to cover the semiconductor element;

a lead to apply an electrical signal to the semiconductor element or to transmit an electrical signal from the semiconductor element; and a heat releasing device disposed on the stem, wherein:

the heat releasing device comprises, a peltiert element, a thermal conduction member for heat absorption disposed on one side of the peltiert element, and a thermal conduction member for heat release disposed on the other side of the peltiert element, and wherein:

the semiconductor element is directly disposed on the thermal conduction member for heat absorption.

According to another aspect of the present invention, a photoelectric conversion module with a cooling function comprises, a semiconductor element to transmit/receive an optical signal, a stem to fix the semiconductor element, a cap to cover the semiconductor element, a lead to apply an electrical signal to the semiconductor element or to transmit an electrical signal from the semiconductor element, and a heat releasing device disposed on the stem, wherein:

the heat releasing device comprises:

a peltiert element, a thermal conduction member for heat absorption disposed on one side of the peltiert element, and a thermal conduction member for heat release disposed on the other side of the peltiert element, and wherein:

the semiconductor element is disposed on the thermal conduction member for heat absorption through a sub-mount.

The peltiert element may preferably pass through the stem and the thermal conduction member for heat release may preferably be arranged outside a package formed of the stem and the cap.

The semiconductor element may preferably comprise an end-face light emitting-type or a surface light emitting-type of a semiconductor laser diode element, and it is preferred that an optical axis of the semiconductor laser diode element be made to correspond to a central axis of the stem.

The heat releasing device may preferably be arranged on the stem so as to be offset from the center of the stem.

The heat releasing device may preferably be arranged centrally on the stem, and the semiconductor element may preferably be disposed on an upper surface of the thermal conduction member for heat absorption.

The sub-mount may preferably be disposed on the upper surface of the thermal conduction member for heat absorption.

The semiconductor element may preferably be disposed on a side of the sub-mount.

A monitoring semiconductor element to monitor an optical signal may preferably be disposed to face the semiconductor element.

A lead to supply a driving power to the peltiert element may preferably be bonded to the thermal conduction member for heat release.

A pattern for soldering may preferably be formed on the thermal conduction member for heat release.

ADVANTAGES OF THE INVENTION

From what is stated above, it is obvious that the following excellent advantages can be achieved according to the present invention.

(1) Reduced number of components and more compact size (2) Forced cooling function in a small package These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

The preferred embodiments according to the invention will be explained below referring to the drawings, wherein:

FIG. 14A is a perspective view showing a main section of a photoelectric conversion module with a cooling function in a tenth preferred embodiment according to the present invention;

FIG. 14B is a perspective view showing a heat sink of FIG. 14A inverted; and

DETAILED DESCRIPTION OF THE PREFERRED EMBODIMENT

First Preferred Embodiment

Figure 2:
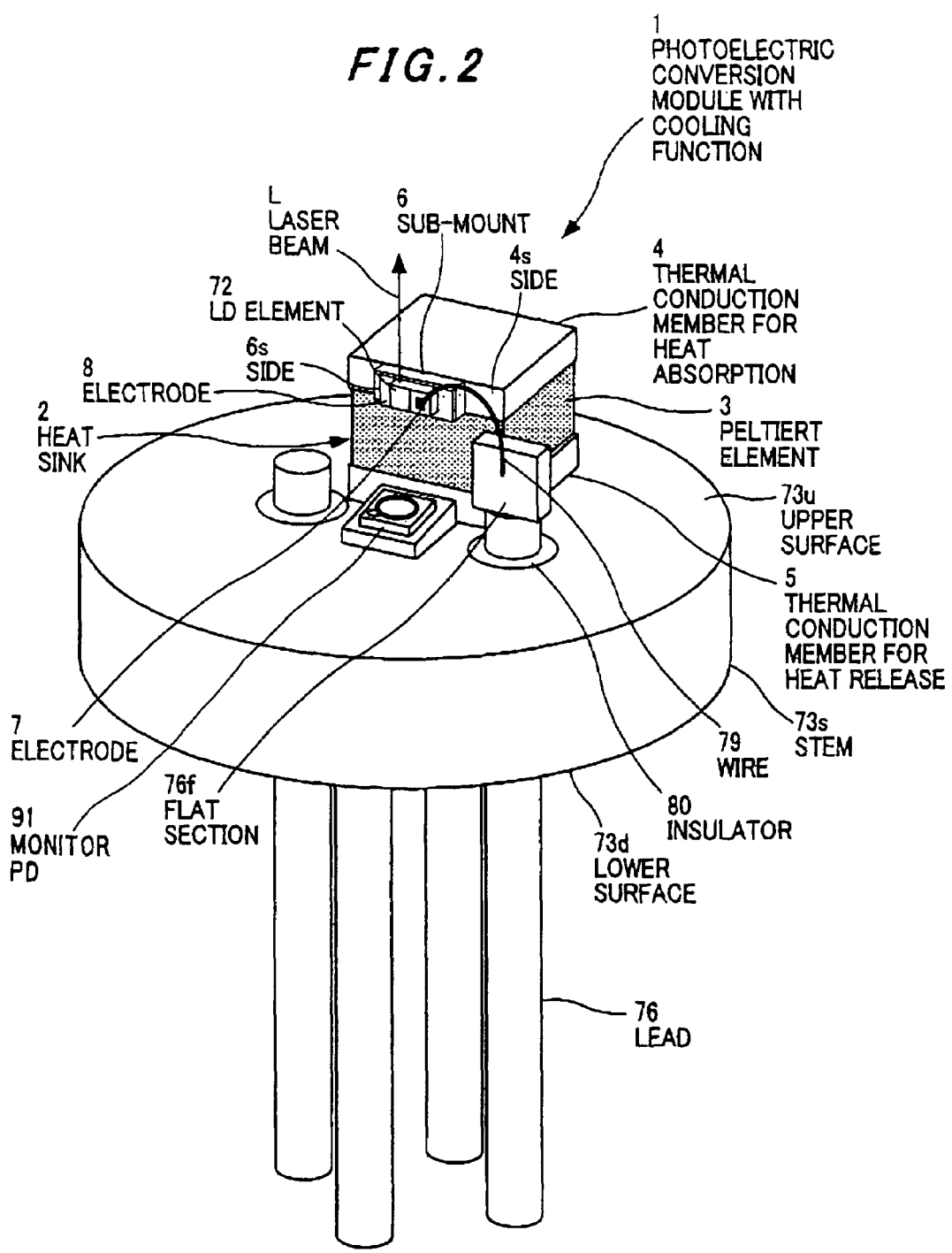
FIG. 2 is a perspective view showing a main section of a photoelectric conversion module with a cooling function in a first preferred embodiment according to the present invention.
Figure 3:
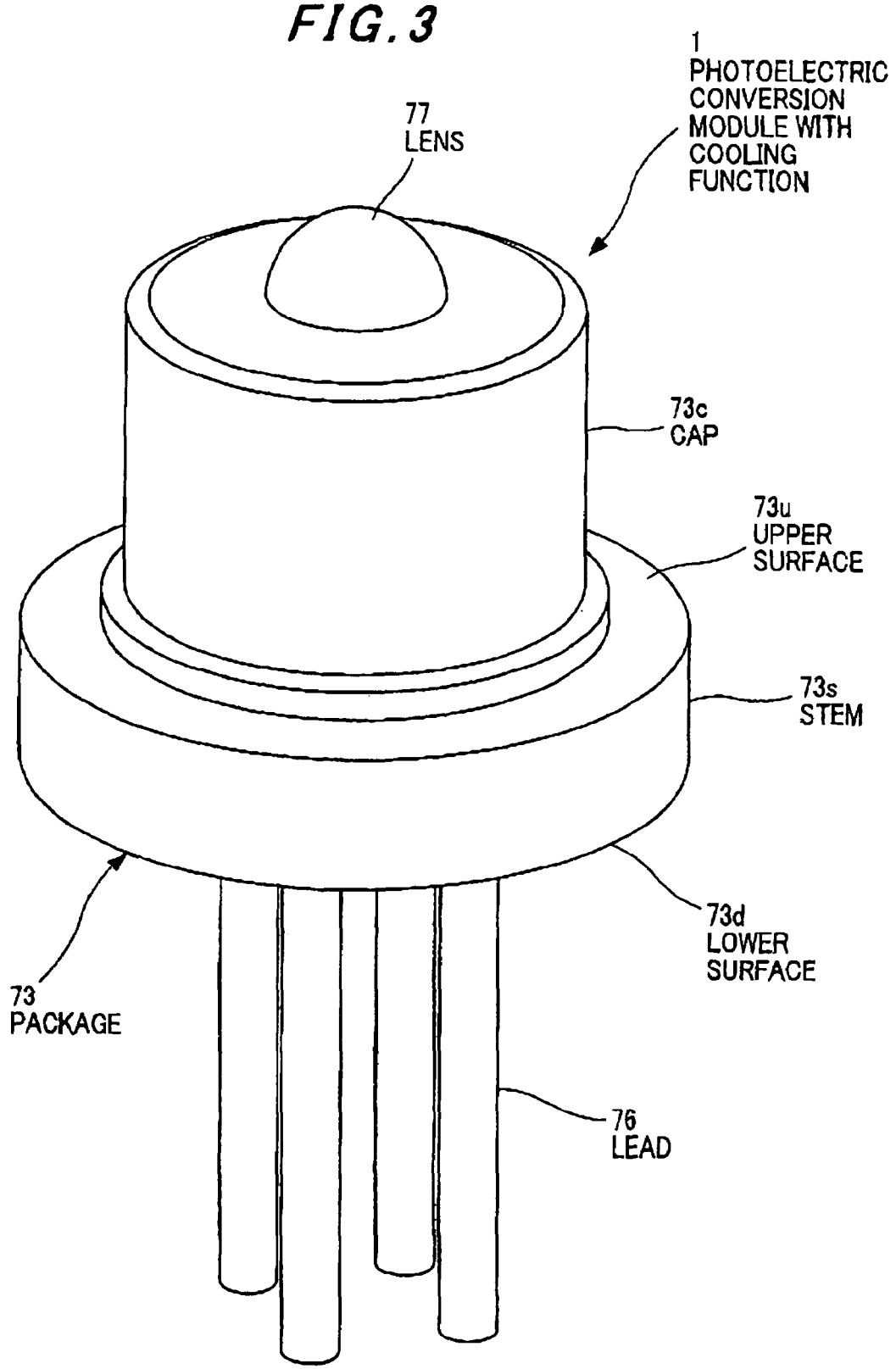
FIG. 3 is an outline view showing the photoelectric conversion module with a cooling function shown in FIG. 2.

FIG. 2 is a perspective view showing a photoelectric conversion module with a cooling function in a first preferred embodiment according to the present invention, and FIG. 3 is an outline view thereof.

FIG. 2 and FIG. 3 show the photoelectric conversion module 1 with a cooling function in the first preferred embodiment. The photoelectric conversion module 1 with a cooling function is principally constructed by housing a semiconductor laser diode (LD) element 72 as a semiconductor element to transmit an optical signal inside a metal package 73, and is also called an LD module.

The package 73 is a "Can package" formed of a disc-shaped stem 73s to fix the LD element 72 and a substantially cylindrical cap (lens cap) 73c to cover an upper surface of the stem 73s and the LD element 72. The package 73 is formed of metal with a high efficiency of heat radiation, for instance, Cu, Cu alloy, CuW, Al, Fe, or the like.

A plurality of metal leads 76 to electrically connect a component such as the LD element 72 inside the package 73 to a component outside the package 73 are mounted to the stem 73s so as to pass through the stem 73s vertically, namely to pass through the package 73 vertically. In the stem 73s, a tubular insulator 80 such as glass is disposed, and the lead 76 is nonconductive to and insulated from the stem 73s due to being inserted into the insulator 80, which also keeps an inside of the package 73 airtight. A lens 77 which collects a laser beam L from the LD element 72 is mounted on an upper portion of the cap 73c.

A heat sink 2 as a heat releasing device to release heat generated by the LD element 72 is fixed on the stem 73s. The heat sink 2 is fixed on the stem 73s by, for instance, soldering or adhesives. The heat sink 2 is much the same in size as the heat sink 174 of the photoelectric conversion module 171 described in FIG. 1 and is small enough to be accommodated in the package 73.

The heat sink 2 is composed of a peltiert element 3 to cool the LD element 72, a thermal conduction member 4 for heat absorption (cover for heat absorption) mounted on an upper surface of the peltiert element 3, and a thermal conduction member 5 for heat release (cover for heat release) mounted on a lower surface of the peltiert element 3. Namely, the bottom face of the thermal conduction member 5 for heat release is in a surface-to-surface contact with the upper surface 73u of the stem 73s.

The thermal conduction member 4 for heat absorption and the thermal conduction member 5 for heat release are formed of metal with a high thermal conductivity (a high efficiency of heat radiation), for instance, Cu, Cu alloy, CuW, Al, Fe, or the like, or of a material with a low coefficient of linear expansion, such as ceramics.

The LD element 72 is fixed on one side 4s of the thermal conduction member 4 for heat absorption through a plate-like sub-mount 6 made of ceramics.

In the first preferred embodiment, since the end-face light emitting-type of the LD element 72 is used, the LD element 72 is fixed on the thermal conduction member 4 for heat absorption through the sub-mount 6 so that an optical axis of the laser beam L emitted upward toward the lens 77 from an end face (a face with a light emitting portion) of the LD element 72 corresponds to a central axis of each of the stem 73s and the cap 73c, and also a central axis of the lens 77. Namely, the LD element 72 is so arranged that the face with the light emitting portion is vertical to the upper surface 73u of the stem 73s.

Besides, the one side 4s of the thermal conduction member 4 for heat absorption and both front and back sides (one side 6s and its opposite side) of the sub-mount 6 are leveled to be in parallel with an optical axis of the laser beam L from the LD element 72.

A cathode of the LD element 72 is electrically connected to the lead 76 by wire-bonding a gilded electrode 7 formed on the surface of the LD element 72 to a flat section 76f of the lead 76 with a wire 79.

Faces to which the wire 79 is mounted are required to be in parallel with each other because otherwise the wire-bonding would be impossible. Therefore, at one end (the upper end in FIG. 2) of the lead 76 to which the wire 79 is mounted, the flat section 76f leveled to be in parallel with the one side 4s of the thermal conduction member 4 for heat absorption, both the front and back sides (one side 6s and its opposite side) of the sub-mount 6, and the electrode 7 is formed.

An anode as a backside of the LD element 72 is soldered to the one side 6s of the sub-mount 6, on which the LD element 72 is mounted, through a gilded electrode 8 formed on the sub-mount 6. In the case of, for instance, a floating-type, which is not illustrated in detail, the anode of the LD element 72 is electrically connected to a different lead 76 by wire-bonding the electrode 8 to the different lead 76 with a wire.

The LD element 72, when an electrical signal is applied through the lead 76 from a component outside the package 73, converts the electrical signal to an optical signal (laser beam) L and transmits (emits) it upward.

Similarly, the peltiert element 3, which is not illustrated in detail, is electrically connected to a further different lead 76 by wire-bonding.

In the first preferred embodiment, since the peltiert element 3 is normally shaped like a plate or cuboid, the cuboid peltiert element 3 forms, in conjunction with the plate-shaped or substantially box-shaped thermal conduction member 4 for heat absorption and thermal conduction member 5 for heat release, the substantially cuboid heat sink 2.

However, the shape of the heat sink 2 is not particularly limited, and it has only to be shaped to have a flat surface to fix the LD element 72.

Figure 1:
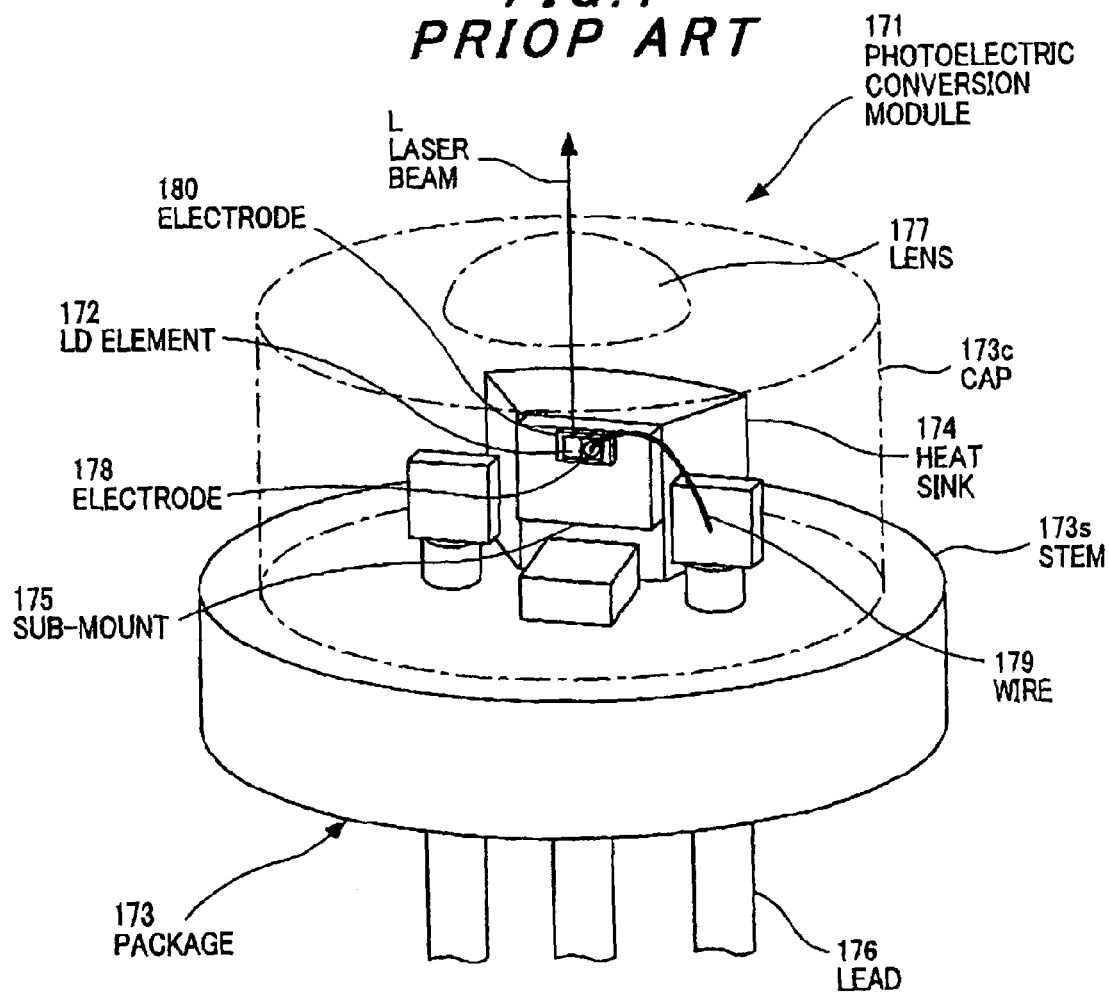
FIG. 1 is a perspective view showing a photoelectric conversion module of the related art.

For instance, a heat sink having a shape, in which a flat surface to mount the LD element 72 is formed on a substantially columnar piece or a sectorial columnar piece adapted to a curvature of an inner surface of the cap 73c, like the heat sink 174 described in FIG. 1, may be used. This also applies to other embodiments.

Temperature control of the peltiert element 3 is performed by monitoring an electric current passing through the LD element 72 by, for instance, a control section of an electronic device into which the photoelectric conversion module 1 is incorporated. Alternatively, the temperature control of the peltiert element 3 may be performed by mounting a temperature sensor such as a thermistor on the thermal conduction member 4 for heat absorption or the sub-mount 6 and monitoring a temperature of the temperature sensor.

After each component has been mounted or attached to the stem 73s, the stem 73s and the cap 73c are air-tightly sealed by resistance welding so that an inert gas (for instance, $N_2$) at room temperature is filled up inside the package 73.

Operations of the first preferred embodiment will now be explained.

When the photoelectric conversion module 1 is energized, heat is generated by the LD element 72. At this moment, the LD element 72 is actively forced cooled by the peltiert element 3. More specifically, passing an electric current through the peltiert element 3 so that absorption of heat other than Joule heat takes place causes the LD element 72 to be actively forced cooled by the peltiert element 3, and consequently the heat generated at the LD element 72 is transmitted in the order of the sub-mount 6, the thermal conduction member 4 for heat absorption, the peltiert element 3, and the thermal conduction member 5 for heat release, and further transmitted to the stem 73s and the cap 73c (refer to FIG. 2) to be released outside the package 73.

This enables the photoelectric conversion module 1 to cool the LD element 72 and release the heat generated at the LD element 72 efficiently, and thus the photoelectric conversion module 1 never reaches such an excessively high temperature that may cause the characteristic of the LD element 72 to be deteriorated. Therefore, the photoelectric conversion module 1 can sufficiently suppress a temperature rise inside the package 73.

In particular, the heat sink 2 has the thermal conduction member 4 for heat absorption mounted on the upper surface of the peltiert element 3, so that a heat absorbing surface of the peltiert element 3 ensuring uniform heat can be formed on the upper portion of the peltiert element 3, and the heat generated by the LD element 72 can be efficiently absorbed. Furthermore, a space to fix the LD element 72 can be obtained.

On the other hand, the heat sink 2 has the thermal conduction member 5 for heat release mounted on the lower surface of the peltiert element 3, so that a heat releasing surface of the peltiert element 3 ensuring uniform heat can be formed on the lower portion of the peltiert element 3, and the heat generated by the LD element 72 can be efficiently released.

Namely, the heat sink 2 is adapted, by forming a base member or column member to fix the LD element 72 by the peltiert element, to make the base member or column member further have a forced cooling function to forced-cool the LD element 72. That is, the heat sink 2 is a component formed by integrating the peltiert element with the heat sink 174 described in FIG. 1 to have a common construction. Especially in the case of the end-face light emitting-type of the LD element 72, the present invention is effective because a base member or column member is absolutely used.

As a result, the photoelectric conversion module 1 does not need to make a new space for a component having a cooling function inside the package 73, and thus even if the cooling function is added, the number of components and size of the photoelectric conversion module 1 can be reduced. Accordingly, the forced cooling function can be realized in a small package.

Further, when the photoelectric conversion module 1 is incorporated into an electronic device such as an optical transceiver, bringing the stem 73s into contact with a substrate or casing thereof will make it possible to further improve the effectiveness of heat release.

In a second to fifth embodiments to be described in FIG. 4 to FIG. 7 below, only a main section of a photoelectric conversion module is illustrated, but the shape and size of a package is the same in all of the embodiments.

Second Preferred Embodiment

Next, a second preferred embodiment according to the present invention will be described.

Figure 4:
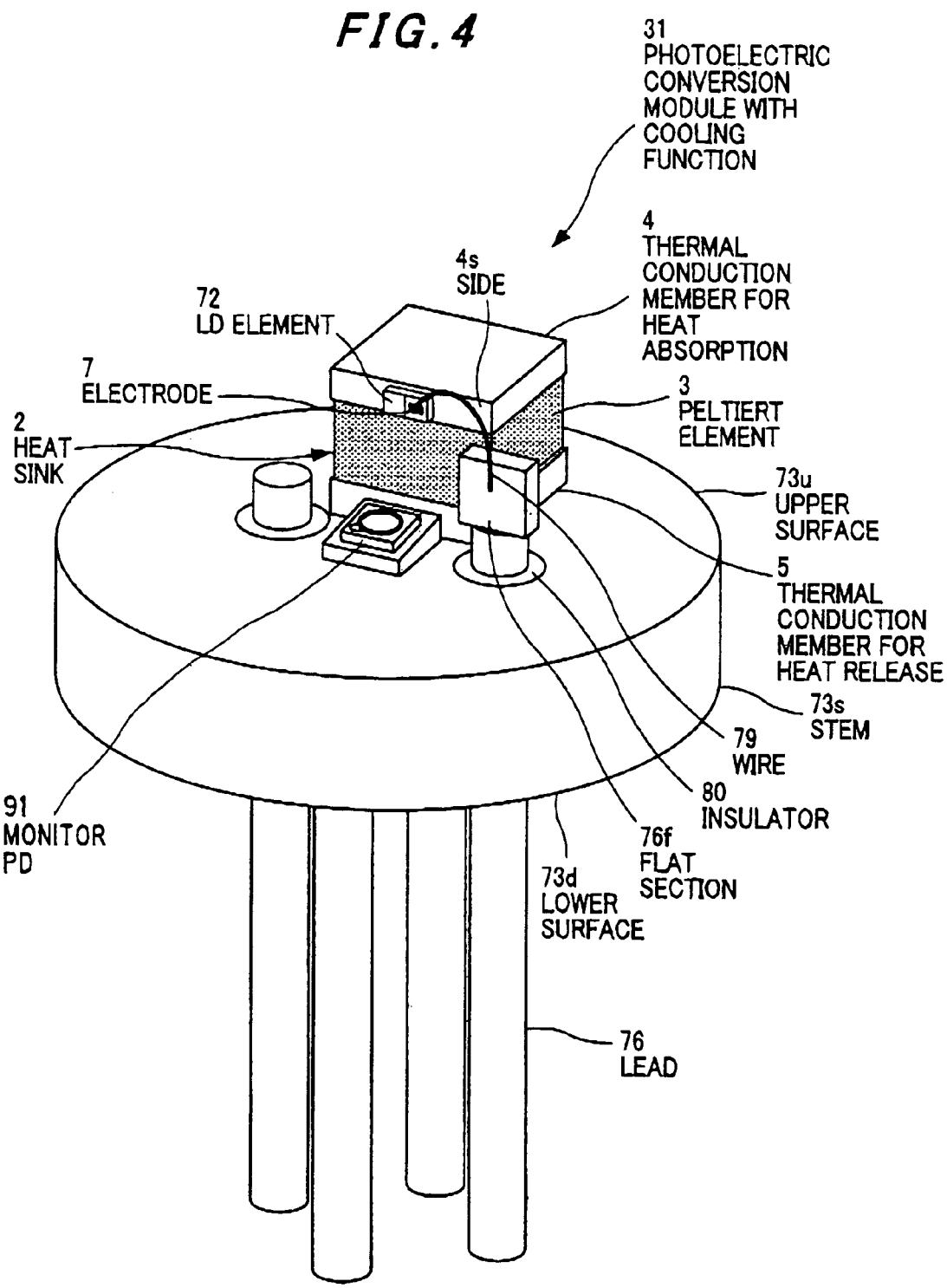
FIG. 4 is a perspective view showing a main section of a photoelectric conversion module with a cooling function in a second preferred embodiment according to the present invention.

FIG. 4 is a perspective view showing a photoelectric conversion module 31 with a cooling function in the second preferred embodiment. The photoelectric conversion module 31 directly fixes the LD element 72 to the thermal conduction member 4 for heat absorption. Aside from this, the constructions of the photoelectric conversion module 31 are the same as those of the photoelectric conversion module 1 in FIG. 2 and FIG. 3.

The photoelectric conversion module 31, as compared to the photoelectric conversion module 1, has the advantage of being able to reduce the number of components because of its lack of the sub-mount 6 (refer to FIG. 2) although it is somewhat difficult to locate the LD element 72. Aside from this, the advantages of the photoelectric conversion module 31 are the same as those of the photoelectric conversion module 1 in FIG. 2 and FIG. 3.

Third Preferred Embodiment

Next, a third preferred embodiment according to the present invention will be described.

Figure 5:
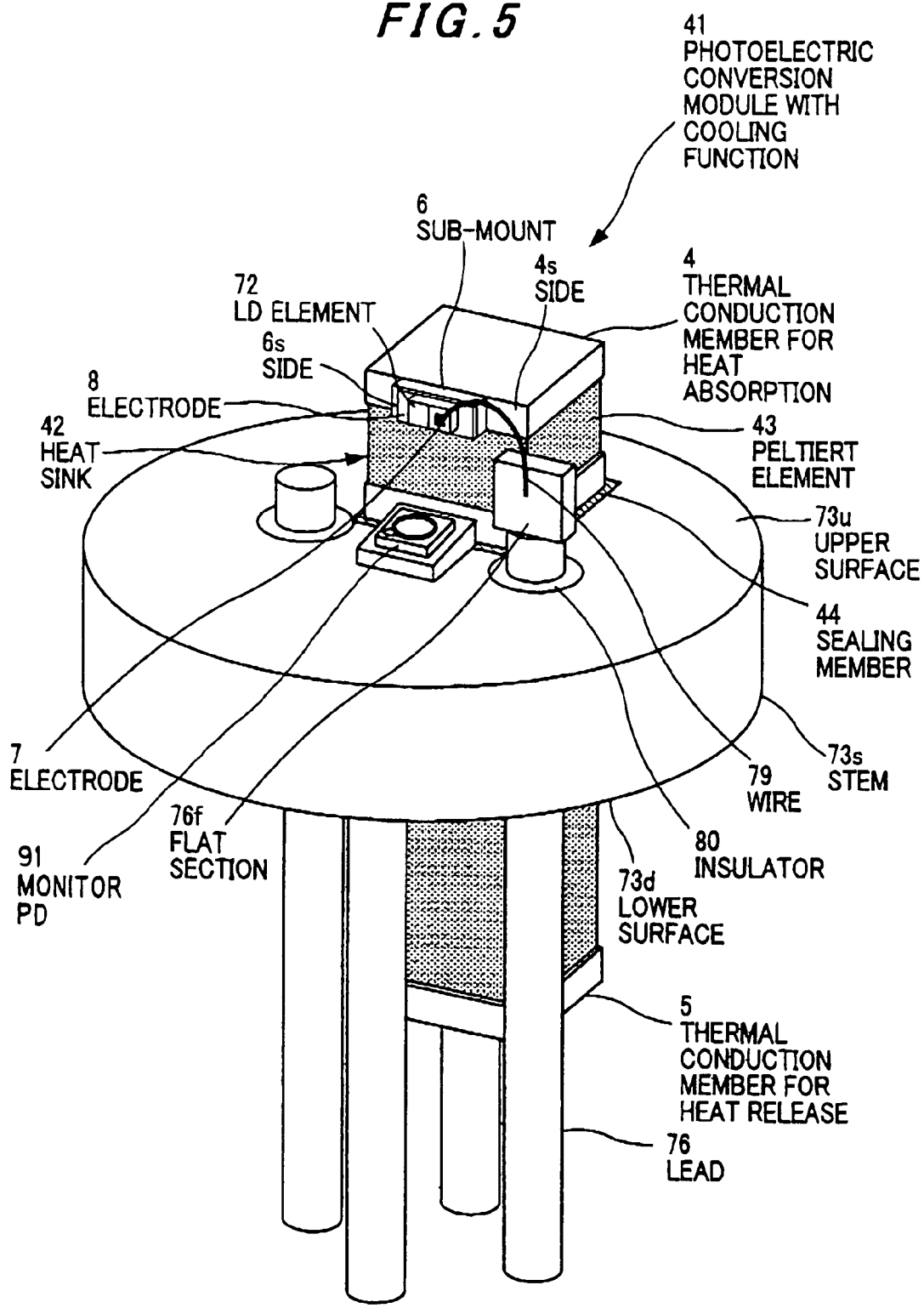
FIG. 5 is a perspective view showing a main section of a photoelectric conversion module with a cooling function in a third preferred embodiment according to the present invention.

FIG. 5 is a perspective view showing a photoelectric conversion module 41 with a cooling function in the third preferred embodiment. The photoelectric conversion module 41 fixes on the stem 73s, a heat sink 42 passing through the stem 73s vertically, namely passing through the package 73 (refer to FIG. 2) vertically, instead of the heat sink 2 in FIG. 2.

The heat sink 42 is formed of a cuboid peltiert element 43 passing through the stem 73s vertically, the thermal conduction member 4 for heat absorption mounted on an upper surface of the peltiert element 43 and arranged inside the package 73, and the thermal conduction member 5 for heat release mounted on a lower surface of the peltiert element 43 and arranged below the lower surface 73d of the stem 73s, namely outside the package 73.

Considering keeping the inside of the package 73 airtight, the stem 73s and the peltiert element 43 are fixed by a sealing member 44, for instance, low-melting glass, resin, adhesives, or the like.

When the photoelectric conversion module 41 is incorporated into an electronic device such as an optical transceiver, bringing the thermal conduction member 5 for heat release into contact with a substrate or casing thereof will make it possible to release the heat generated at the LD element 72 to the outside of the package 73 without the stem 73s, and consequently transmission of the heat gets better compared to the photoelectric conversion module 1 in FIG. 2, thereby further improving the effectiveness of heat release.

Besides, since the volume of the peltiert element 43 is larger than that of the peltiert element 3 in FIG. 2, the photoelectric conversion module 41 has the advantage of being able to carry out more efficiently the cooling of the LD element 72 and the release of the heat generated by the LD element 72 to the outside of the package 73. Aside from this, the advantages of the photoelectric conversion module 41 are the same as those of the photoelectric conversion module 1.

Fourth Preferred Embodiment

Next, a fourth preferred embodiment according to the present invention will be described.

Figure 6:
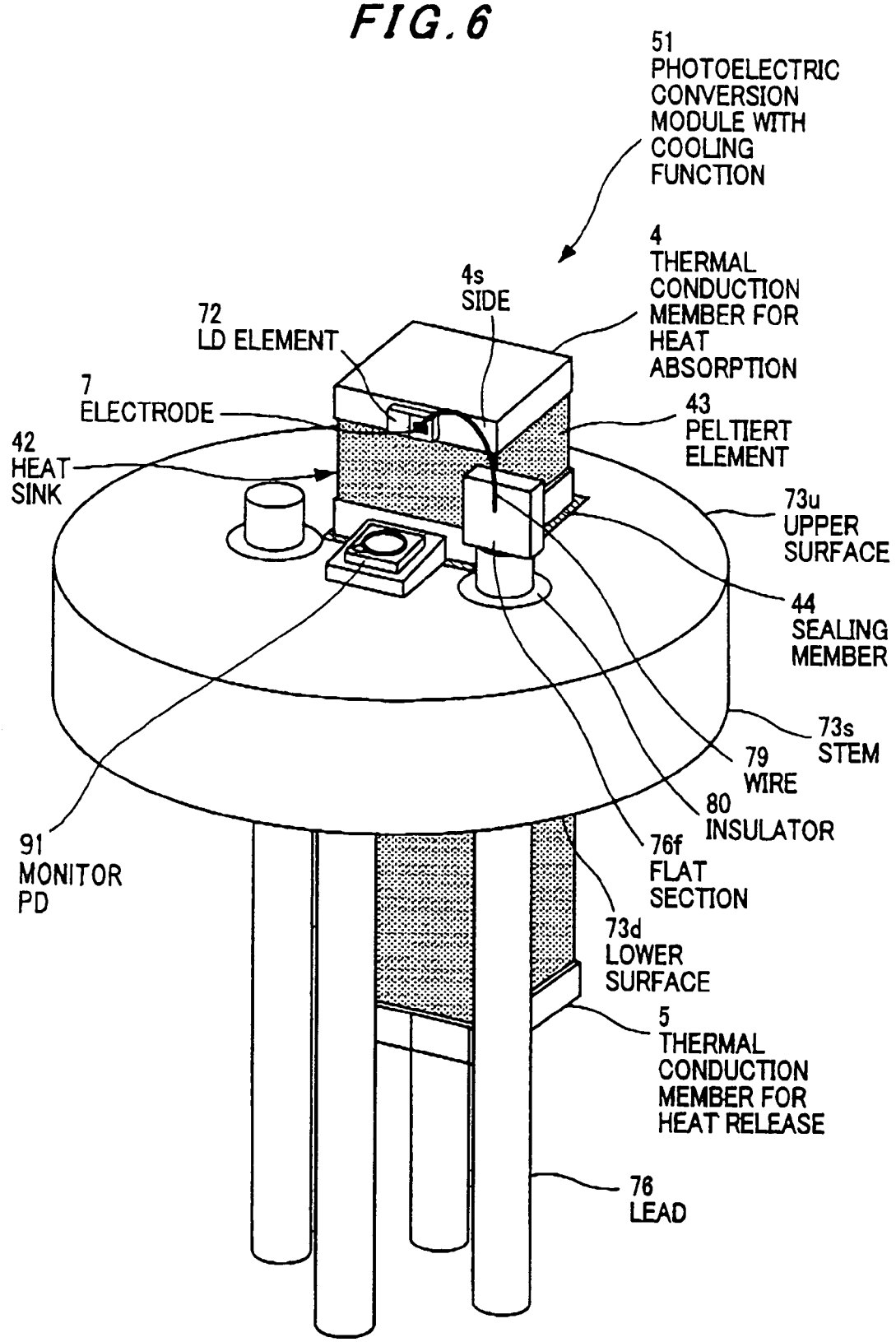
FIG. 6 is a perspective view showing a main section of a photoelectric conversion module with a cooling function in a fourth preferred embodiment according to the present invention.

FIG. 6 is a perspective view showing a photoelectric conversion module 51 with a cooling function in the fourth preferred embodiment. The photoelectric conversion module 51 directly fixes the LD element 72 to the thermal conduction member 4 for heat absorption. Aside from this, the constructions of the photoelectric conversion module 51 are the same as those of the photoelectric conversion module 1 in FIG. 5.

The photoelectric conversion module 51, as compared to the photoelectric conversion module 41, has the advantage of being able to reduce the number of components because of its lack of the sub-mount 6 (refer to FIG. 5). Aside from this, the advantages of the photoelectric conversion module 51 are the same as those of the photoelectric conversion module 41 in FIG. 5.

In the above embodiments, description has been made of an example where the end-face light emitting-type of the LD element 72 is used as a semiconductor element, but a surface light emitting-type (VICSEL-type) of an LD element may be used as a semiconductor element as will be described below.

Fifth Preferred Embodiment

Next, a fifth preferred embodiment according to the present invention will be described.

Figure 7:
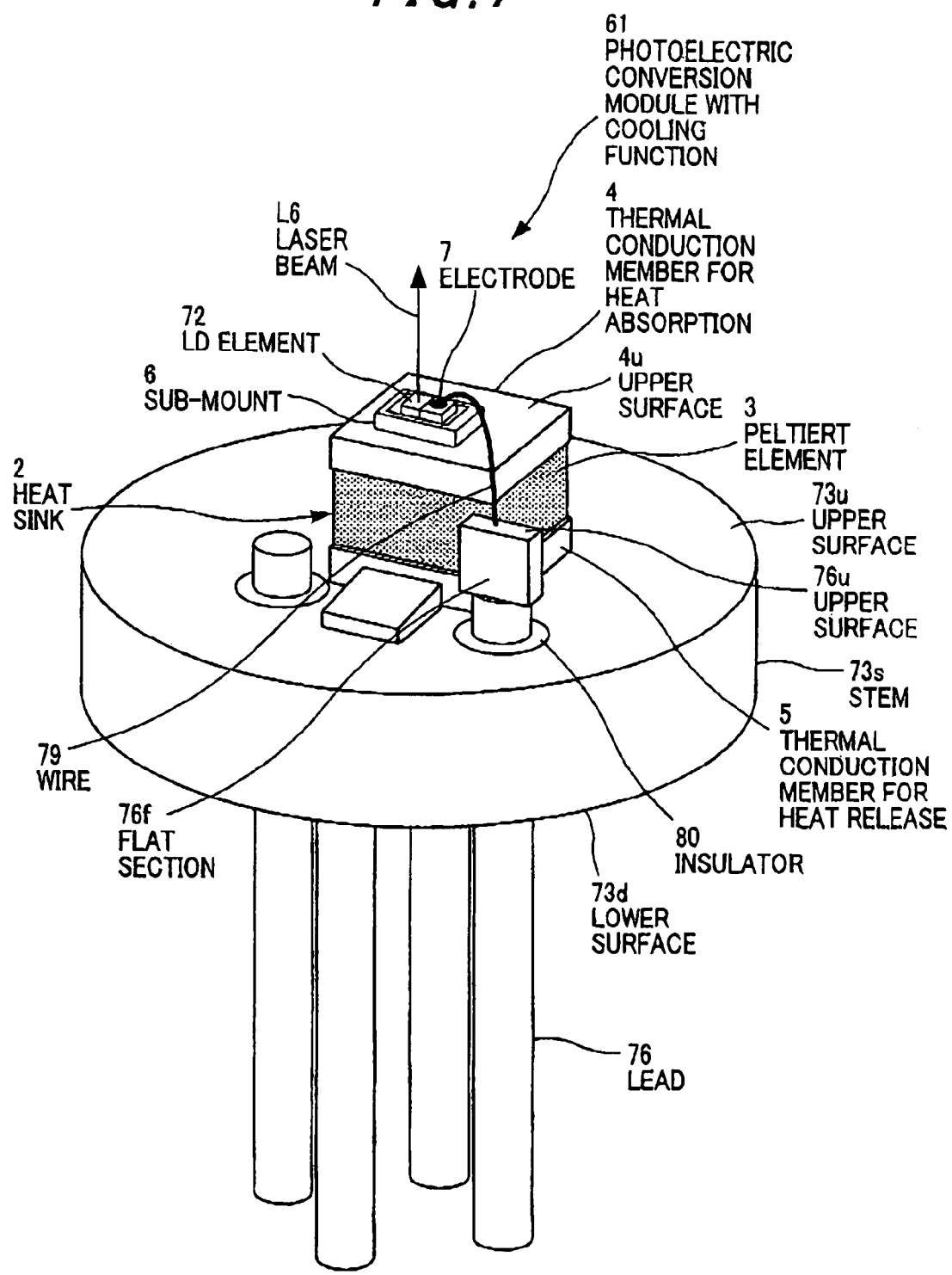
FIG. 7 is a perspective view showing a main section of a photoelectric conversion module with a cooling function in a fifth preferred embodiment according to the present invention.

FIG. 7 shows a perspective view showing a photoelectric conversion module 61 with a cooling function in the fifth preferred embodiment. The photoelectric conversion module 61 fixes the surface light emitting-type of the LD element 72 on an upper surface 4u of the thermal conduction member 4 for heat absorption through the sub-mount 6. Aside from this, the constructions of the photoelectric conversion module 61 are the same as those of the photoelectric conversion module 1 in FIG. 2.

In the fifth preferred embodiment, since the surface light emitting-type of the LD element 72 is used, the LD element 72 is mounted on the thermal conduction member 4 for heat absorption through the sub-mount 6 so that an optical axis of a laser beam L6 emitted upward toward the lens 77 (refer to FIG. 3) from an upper surface (a face with a light emitting portion) of the LD element 72 corresponds to the central axis of the lens 77. Namely, the LD element 72 is so arranged that the face with the light emitting portion is parallel with the upper surface 73u of the stem 73s.

A cathode of the LD element 72 is electrically connected to the lead 76 by wire-bonding the electrode 7 to an upper surface 76u of the upper end of the lead 76 with the wire 79. The upper surface 76u of the upper end of the lead 76 is leveled to be in parallel with the upper surface 4u of the thermal conduction member 4 for heat absorption and the electrode 7.

The photoelectric conversion module 61 brings the same advantages as the photoelectric conversion module 1 in FIG. 2. Further, in the photoelectric conversion modules 31, 41, and 51 described in FIG. 4 to FIG. 6, which are not illustrated in detail, mounting the LD element 72 on the upper surface of the thermal conduction member 4 for heat absorption also brings the same advantages as the photoelectric conversion modules 31, 41, and 51.

In the above embodiments, description has been made of an example where the LD element 72 is used as a semiconductor element, but as a semiconductor element, for example, a light emitting diode (LED) element, or a photodiode (PD) element to receive an optical signal may be used. Furthermore, the photoelectric conversion module is not limited to the LD module, and any semiconductor module including but not limited to the LED module and the PD module may be used as long as it includes a semiconductor element which generates heat upon consumption of power.

Incidentally, the end-face light emitting-type of the LD element emits a light from a front end and a rear end thereof. When a front outgoing beam is assumed to be an outgoing beam from a photoelectric conversion module, a rear outgoing beam is generally used as a monitor light to check for light emitting of the LD element or to feedback-control luminescence intensity. Therefore, it is suggested that in the photoelectric conversion modules 1, 31, 41, and 51 in FIG. 2 and FIG. 4 to FIG. 6 described heretofore, a monitor PD be disposed below the LD element 72. From the fact that the optical axis of the laser beam L emitted upward from the LD element 72 is located at the central axis of the stem 73s, the monitor light emitted downward is also located at the central axis of the stem 73s, and thus the monitor PD will also have to be mounted at the center of the stem 73s.

Sixth Preferred Embodiment

A sixth preferred embodiment according to the present invention will be described as an arrangement including a monitor PD.

Figure 8:
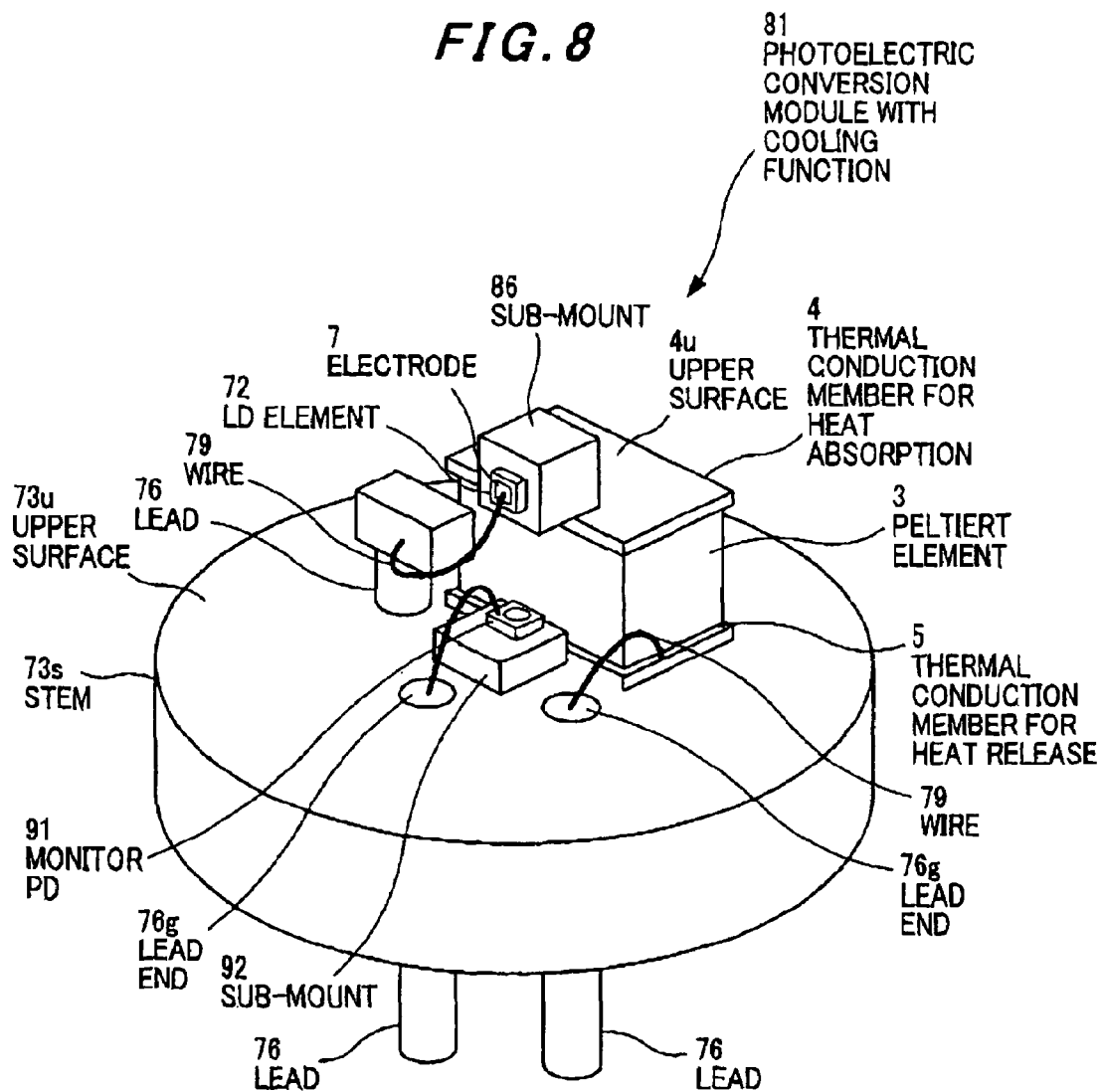
FIG. 8 is a perspective view showing a main section of a photoelectric conversion module with a cooling function in a sixth preferred embodiment according to the present invention.

FIG. 8 is a perspective view showing a photoelectric conversion module 81 with a cooling function in the sixth preferred embodiment. The photoelectric conversion module 81 fixes the LD element 72 on the upper surface 4u of the thermal conduction member 4 for heat absorption through a sub-mount 86. The lead 76 for the LD element 72 has, as described above, a flat section parallel with the electrode 7 of the LD element 72, and from this flat section, wire-bonding to the electrode 7 is performed with the wire 79. In FIG. 8, there is also shown a lead 76 to supply power to the peltiert element 3. This lead 76 has a lead end 76g appearing on a level with the upper surface 73u of the stem 73s, and from this lead end 76g of the lead 76, wire-bonding to the peltiert element 3 is performed with a wire 79. And, a monitor PD 91 is arranged directly under the LD element 72. The monitor PD 91 is attached to a monitor sub-mount 92, which is fixed on the upper surface 73u of the stem 73s. The monitor PD 91 is wire-bonded from a lead end 76g of a different lead 76 with a wire 79. Aside from these, the constructions of the photoelectric conversion module 81 are the same as those of the photoelectric conversion module 1 in FIG. 2 and FIG. 3.

In the photoelectric conversion module 81, the sub-mount 86, being greater in thickness (height) than those described above, is disposed on the upper surface 4u of the thermal conduction member 4 for heat absorption so as to protrude from an end thereof, and on a protruding side of the sub-mount 86, the LD element 72 is mounted. Therefore, as viewed from a different angle, an optical axis of a monitor light L' emitted downward from the LD element 72 corresponds to the monitor PD 91 as illustrated in FIG. 9.

In general, a sub-mount is provided to relieve stress caused by a difference in coefficient of thermal expansion between an LD element and an object on which it is to be mounted (heat sink or the like, in the case of the present invention, the thermal conduction member 4 for heat release), and from the viewpoint of heat release (heat absorption) it is preferable that the thickness of the sub-mount be smaller. However, herein, the LD element 72 is mounted on a side of the sub-mount 86 made in an increased thickness in order to obtain the advantage of being easy to align the optical axis of the LD element 72 with that of the monitor PD 91. Alignment of the two optical axes can be easily done by displacing the sub-mount 86 on the upper surface 4u of the thermal conduction member 4 for heat absorption. Aside from this, the advantages of the photoelectric conversion module 81 in FIG. 8 are the same as those of the photoelectric conversion module 1 in FIG. 2 and FIG. 3.

Figure 9:
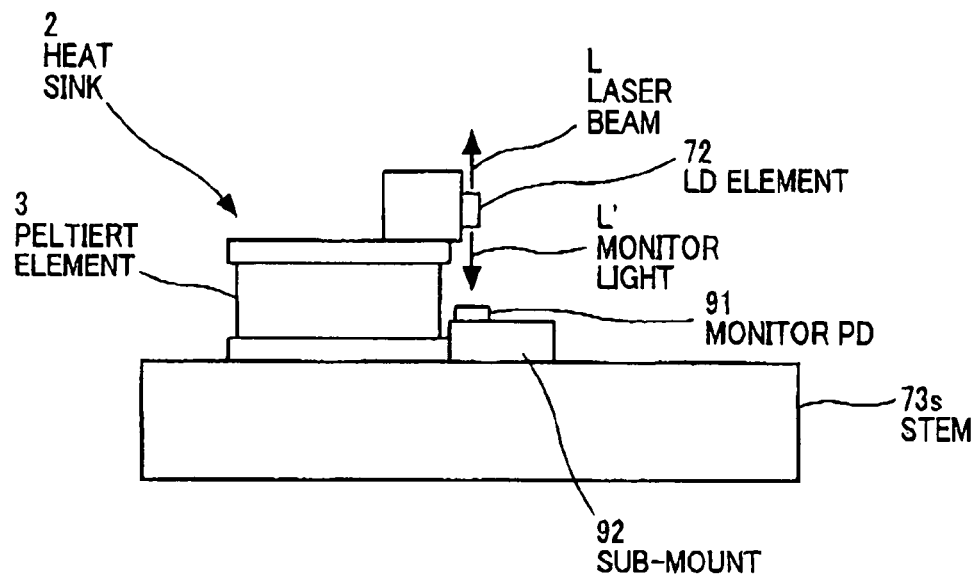
FIG. 9 is a partly enlarged side view showing the photoelectric conversion module shown in FIG. 8.

As is clear from FIG. 9, the heat sink 2 including the peltiert element 3 is arranged offset from the center of the stem 73s. This enables the monitor PD 91 to be arranged at the center of the 73s, which the optical axis of the monitor light L' runs through.

However, with respect to the peltiert element 3 arranged offset from the center of the stem 73s, only the one having a smaller area than the stem 73s can be mounted. If, on the contrary, an attempt is made to mount a large peltiert element while ensuring the arrangement of the monitor PD, there is no other choice but to make an entire photoelectric conversion module larger.

Seventh Preferred Embodiment

Then, a seventh preferred embodiment according to the present invention will be described as an arrangement that permits upsizing of a peltiert element without changing the entire size of a photoelectric conversion module.

Figure 10:
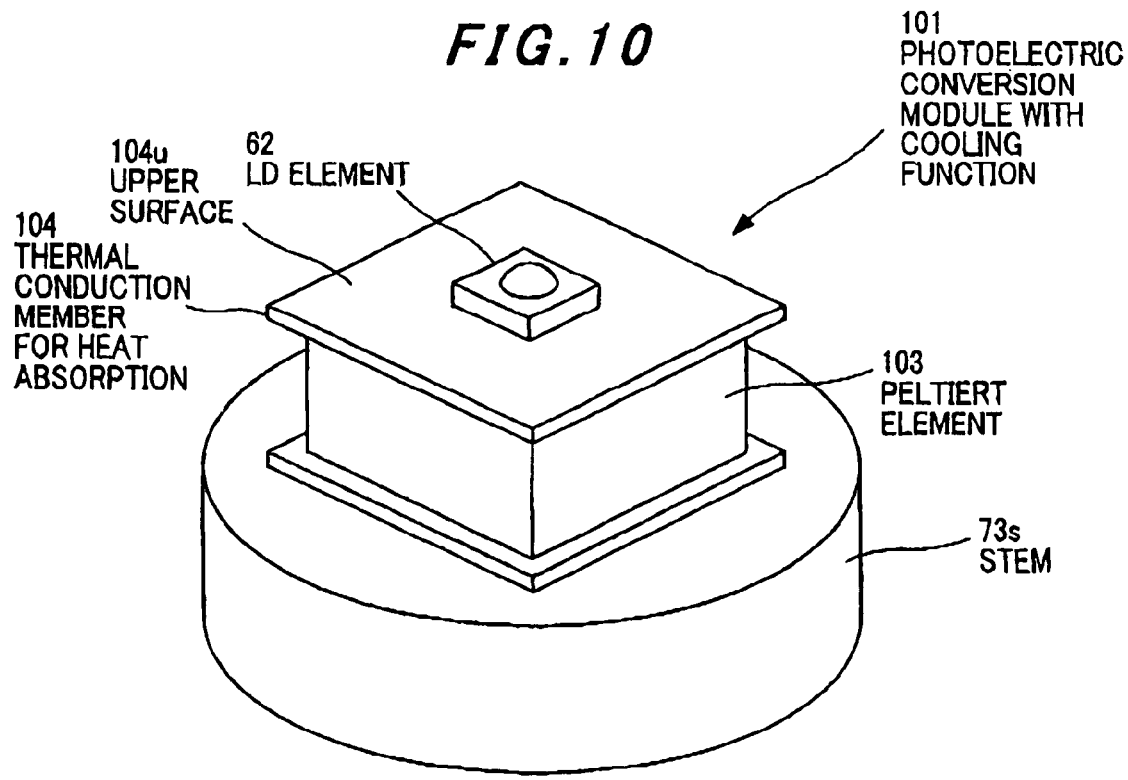
FIG. 10 is a perspective view showing a main section of a photoelectric conversion module with a cooling function in a seventh preferred embodiment according to the present invention.

FIG. 10 is a perspective view showing a photoelectric conversion module 101 with a cooling function in the seventh preferred embodiment. The photo electric conversion module 101, directly fixes the surface light emitting-type of the LD element 62 on an upper surface 104u of the thermal conduction member 104 for heat absorption. A peltiert element 103 is arranged at the center of the stem 73s, and it is larger in size and has a higher cooling capacity than the peltiert elements described above. A lead (not shown) has, as the one in FIG. 8, an end face level with the upper surface 73u of the stem 73s to be in contact with a lower surface of the thermal conduction member 5 for heat release. Aside from these, the constructions of the photoelectric conversion module 101 are the same as those of the photoelectric conversion module 1 in FIG. 7.

In the seventh preferred embodiment, since the surface light emitting-type of the LD element 62 is used, a monitor light cannot be taken out, but because of no need for a monitor PD, there are no restrictions in the location and size of the peltiert element 103, and thus the large peltiert element 103 having a high cooling capacity can be used. Aside from this, the advantages of the photoelectric conversion module 101 in FIG. 10 are the same as those of the photoelectric conversion module 1 in FIG. 7.

The advantage of arranging the LD element on the upper surface 104u of the thermal conduction member 104 for heat absorption is that the size of the peltiert element can be increased.

Eighth Preferred Embodiment

Then, a eighth preferred embodiment according to the present invention will be described as an arrangement wherein an end-face light emitting-type of an LD element is arranged on the upper surface 104u of the thermal conduction member 104 for heat absorption.

Figure 11:
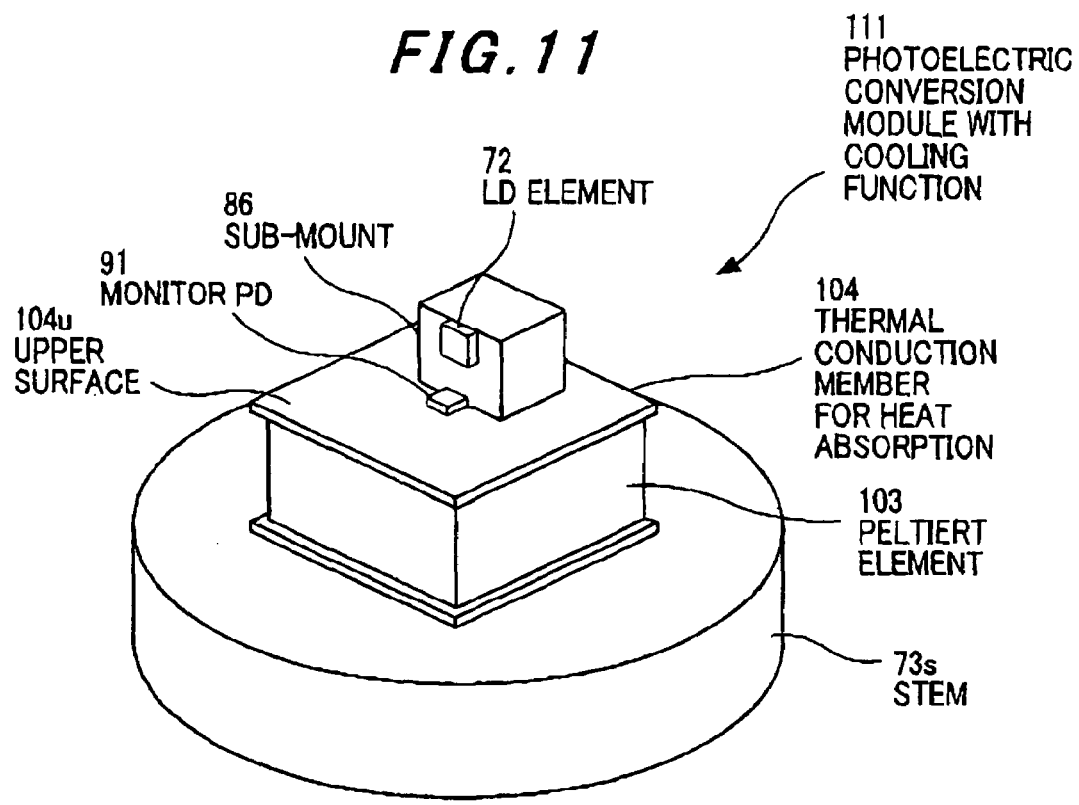
FIG. 11 is a perspective view showing a main section of a photoelectric conversion module with a cooling function in an eighth preferred embodiment according to the present invention.

FIG. 11 is a perspective view showing a photoelectric conversion module 111 with a cooling function in the eighth preferred embodiment. The photo electric conversion module 111 fixes the end-face light emitting-type of the LD element 72 on the upper surface 104u of the thermal conduction member 104 for heat absorption through the sub-mount 86, and also mounts the monitor PD 91 on the upper surface 104u of the thermal conduction member 104 for heat absorption. The large peltiert element 103 as in FIG. 10 is arranged at the center of the stem 73s. The sub-mount 86 has the same thickness as the one in FIG. 8, and on a side of the sub-mount 86, the LD element 72 is mounted. And the arrangement on the thermal conduction member 104 for heat absorption is determined so that the optical axis of each of the LD element 72 and the monitor PD 91 is located at the center of the stem 73s.

Figure 12:
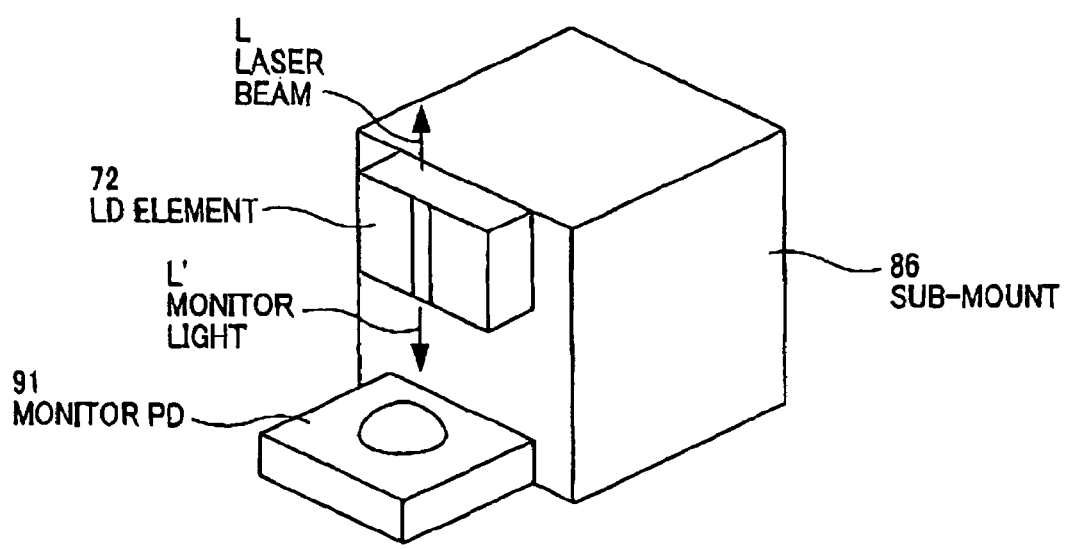
FIG. 12 is a partly enlarged perspective view showing the photoelectric conversion module shown in FIG. 10.

The sub-mount 86 is formed in the shape of a square pole as shown in FIG. 12. The LD element 72 is fixed on the side of the sub-mount 86 so that the optical axis of the laser beam L emitted from a front end of the LD element 72 points upward. The optical axis of the monitor light L' emitted downward from a rear end of the LD element 72 corresponds to the monitor PD 91.

In the eighth preferred embodiment, since the LD element 72 and the monitor PD 91 are arranged on the upper surface 104u of the thermal conduction member 104 for heat absorption, the restrictions in the location and size of the peltiert element 103 are eased, and thus the large peltiert element 103 having a high cooling capacity can be used.

Ninth Preferred Embodiment

Next, a ninth preferred embodiment according to the present invention will be described as an arrangement that reduces the number of wire-bonding points to facilitate assembly.

Figure 13A:
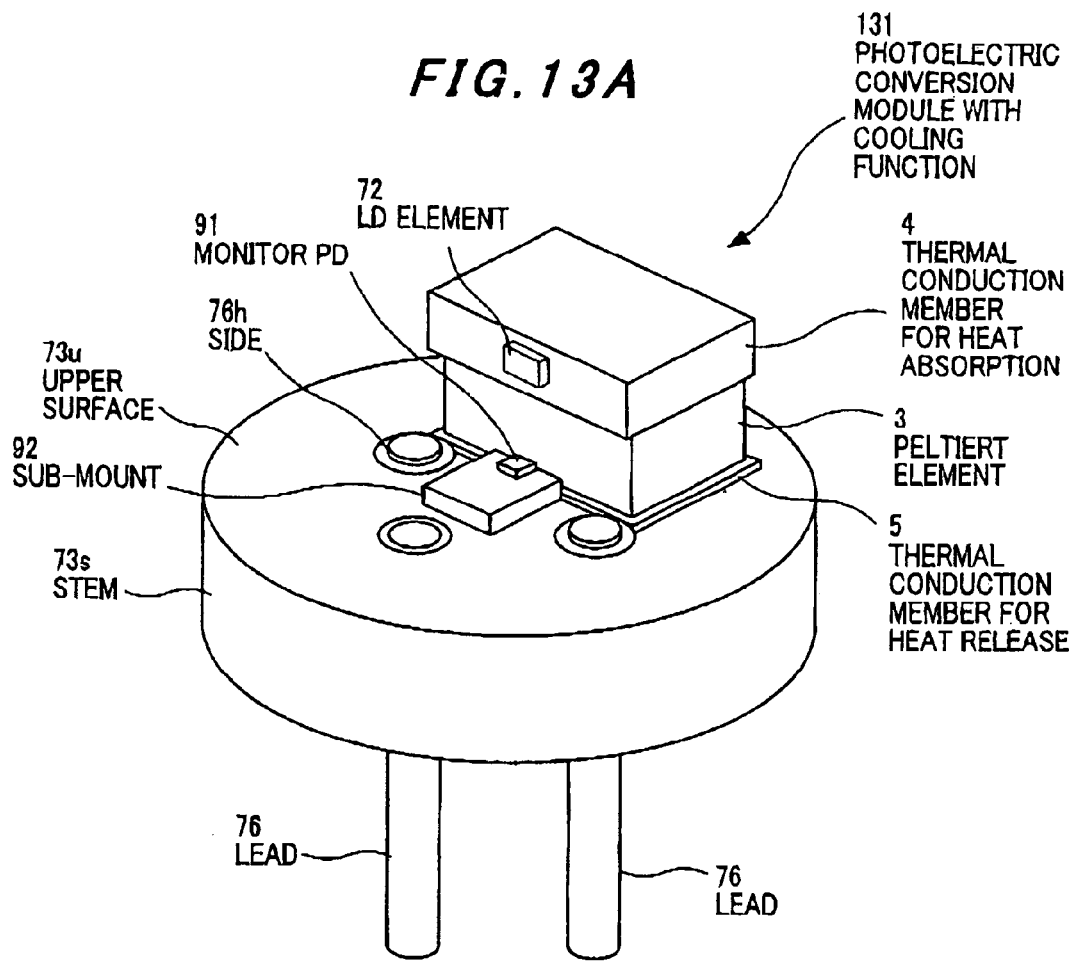
FIG. 13A is a perspective view showing a main section of a photoelectric conversion module with a cooling function in a ninth preferred embodiment according to the present invention.

FIG. 13A is a perspective view showing a photoelectric conversion module 131 with a cooling function in the ninth preferred embodiment. In the photoelectric conversion module 131, two leads 76 protrude slightly from the upper surface 73u of the stem 73s, and sides 76h of these leads, being in contact with the thermal conduction member 5 for heat release, are soldered thereto. On the thermal conduction member 5 for heat release, there is provided an electrode for the peltiert element 3, description of which has been omitted so far.

Figure 13B:
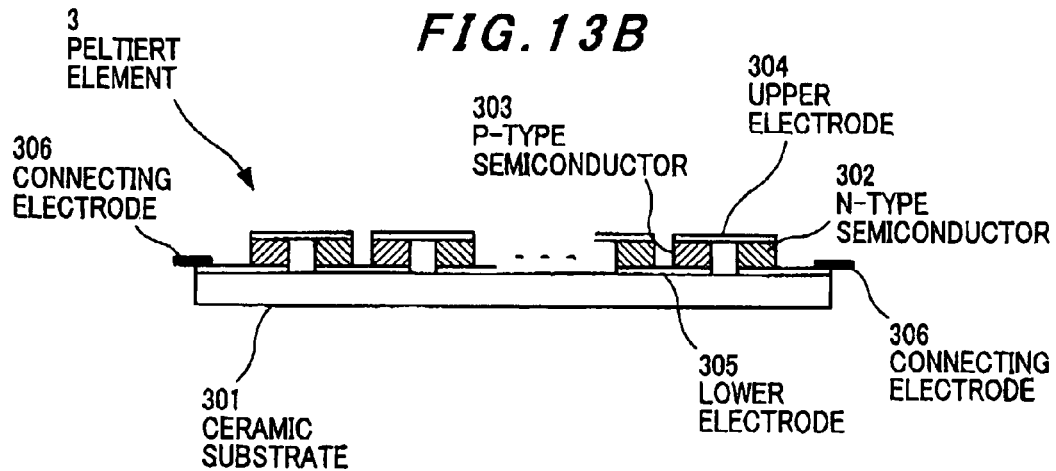
FIG. 13B is a schematic diagram showing an internal structure of a peltiert element.

FIG. 13B is a schematic diagram showing an internal structure of the peltiert element 3. In the peltiert element 3, a plurality of N-type semiconductors 302 and P-type semiconductors 303 are alternately arranged lengthwise and crosswise on a ceramic substrate 301, wherein each of the semiconductors 302 and 303 are, in turn, connected in series in such a manner that an upper electrode 304 is passed from an upper surface of an N-type semiconductor 302 to an upper surface of an adjacent P-type semiconductor 303 thereof, and a lower electrode 305 is passed from a lower surface of the P-type semiconductor 303 to a lower surface of a different N-type semiconductor 302, and a connecting electrode 306 such as a lead is formed on the lower electrode 305 providing a beginning and a termination of the series connection. It is suggested that the connecting electrode 306 be fixed on a surface of the thermal conduction member 5 for heat release in FIG. 13A.

In the ninth preferred embodiment, as the two leads 76 are in contact with the thermal conduction member 5 for heat release, they can be directly soldered to the connecting electrode 306. Since the leads 76 are designed to be directly soldered to the thermal conduction member 5 for heat release, the number of wire-bonding points is reduced, and assembly is thereby facilitated.

Tenth Preferred Embodiment

Lastly, a tenth preferred embodiment according to the present invention will be described.

FIG. 14A is a perspective view showing a photoelectric conversion module 141 with a cooling function in the tenth preferred embodiment, and FIG. 14B is a perspective view showing a heat sink of FIG. 14A inverted. In the photoelectric conversion module 141, a pattern 142 for soldering is formed on the bottom face of the thermal conduction member 5 for heat release. The lead 76 has the lead end 76g appearing on a level with the upper surface 73u of the stem 73s, and the heat sink 2 is arranged on the stem 73s so that the pattern 142 for soldering on the thermal conduction member 5 for heat release makes contact with the lead end 76g to be bonded thereto by soldering or brazing.

In the tenth preferred embodiment, since the pattern 142 for soldering is formed on the bottom face of the thermal conduction member 5 for heat release, assembly becomes much easier than in the ninth preferred embodiment.

Furthermore, in the photoelectric conversion module 141 with a cooling function shown in FIG. 14A, the thermal conduction member 4 for heat absorption is formed in a greater thickness, the side 4s of the thermal conduction member 4 for heat absorption is plated, and the end-face light emitting-type of the LD element 72 is fixed on the plated surface.

The side 4s of the thermal conduction member 4 for heat absorption may be covered with a metal or ceramic member instead of being plated, and it is desirable that an LD be mounted on the metal or ceramic member.

Next, taking as an example the photoelectric conversion module 141 with a cooling function in FIG. 14 (equivalent in FIG. 2 and the others), a pin configuration of the lead 76 on the upper surface 73u of the stem 73s will be described.

Figure 15:
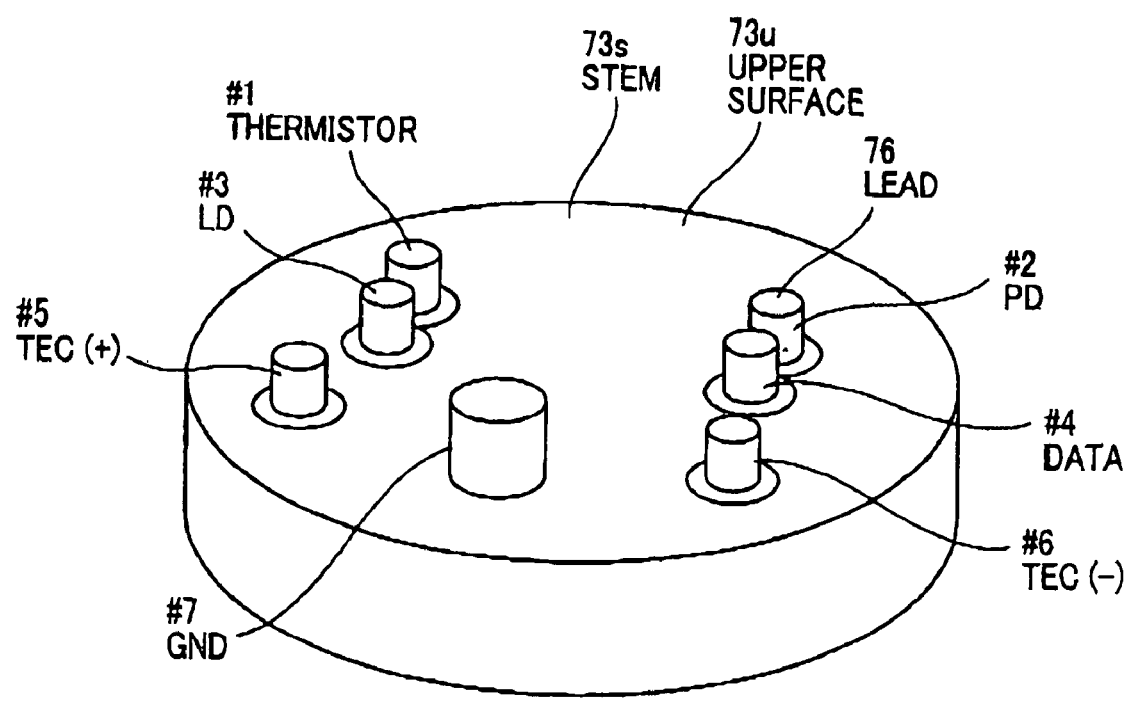
FIG. 15 is a perspective view showing a stem together with a lead arrangement.

FIG. 15 is a perspective view showing a stem together with a lead arrangement. In an example shown in FIG. 15, seven kinds of leads 76 are arranged on the upper surface 73u of the stem 73s. The leads 76, when distinguished by their respective signal names, are thermistor #1, monitor PD #2, LD #3, Data #4, TEC (+) #5, TEC (−) #6, and Gnd #7.

The thermistor #1 is the lead 76 to pick up an output from the temperature sensor as mentioned briefly in the first preferred embodiment (FIG. 2). The monitor PD #2 is the lead 76 to pick up an output from the monitor PD 91 described in the sixth preferred embodiment (FIG. 8) and the subsequent preferred embodiments. The LD #3 is the lead 76 to input a driving voltage of the LD element 72 in FIG. 2 and so on. The Data #4 is the lead 76 to input a driving signal of the LD element 72. The TEC (+) #5 and the TEC (−) #6 are the leads 76 for both poles of the peltiert element 3. The Gnd #7 is the lead 76 to provide a common ground.

Each of the leads 76 may have the leveled flat section 76f formed as in FIG. 4 and so on, or have the lead end 76g formed on a level with the upper surface 73u of the stem 73s as in the embodiment of FIG. 8, or protrude form the upper surface 73u of the stem 73s as in the embodiment of FIG. 13.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A photoelectric conversion module with a cooling function, comprising:
    a device adapted to transmit or to receive an optical signal;
    a stem to fix the device adapted to transmit or to receive an optical signal;
    a cap to cover the device adapted to transmit or to receive an optical signal;
    a lead to apply an electrical signal to the device adapted to transmit or to receive an optical signal or to transmit an electrical signal from the device adapted to transmit or to receive an optical signal, and
    a heat releasing device disposed on the stem,
    wherein the heat releasing device comprises:
        a peltiert element;
        a thermal conduction member for heat absorption disposed on one side of the peltiert element; and
        a thermal conduction member for heat release disposed on another side of the peltiert element,
        wherein the device adapted to transmit or to receive an optical signal is disposed on a side surface of the thermal conduction member for heat absorption.

2. The photoelectric conversion module with a cooling function according to claim 1, wherein:
    the peltiert element passes through the stem, and
    the thermal conduction member for heat release is arranged outside a package formed on the stem and the cap.

3. The photoelectric conversion module with a cooling function according to claim 1, wherein:
    the device adapted to transmit or to receive an optical signal comprises:
    an end-face light emitting-type semiconductor laser diode element;
    wherein an optical axis of the device adapted to transmit or to receive an optical signal corresponds to a central axis of the stem.

4. The photoelectric conversion module with a cooling function according to claim 1, wherein:
    the heat releasing device is arranged on the stem so as to be offset from the center of the stem.

5. The photoelectric conversion module with a cooling function according to claim 1, wherein:
    the heat releasing device is arranged centrally on the stem, and
    the device adapted to transmit or to receive an optical signal is disposed on an upper surface of the thermal conduction member for heat absorption.

6. The photoelectric conversion module with a cooling function according to claim 1, wherein:
    a monitoring semiconductor element adapted to monitor the optical signal is disposed on a plane different from the surface on which the device adapted to transmit or to receive an optical signal is disposed to face the device adapted to transmit or to receive an optical signal.

7. The photoelectric conversion module with a cooling function according to claim 1, wherein:
    a lead to supply a driving power to the peltiert element is bonded to the thermal conduction member for heat release.

8. The photoelectric conversion module with a cooling function according to claim 7, wherein:
    a pattern for soldering is formed on the thermal conduction member for heat release.

9. The photoelectric conversion module with a cooling function according to claim 1, wherein:
    the side surface of the thermal conduction member for heat absorption is normal to at least one of an upper surface and a lower surface of the peltiert element.

10. The photoelectric conversion module with a cooling function according to claim 1, wherein:
    the thermal conduction member for heat absorption has a top surface that is substantially normal to the side surface of the thermal conduction member for heat absorption.

11. The photoelectric conversion module with a cooling function according to claim 1, wherein:
    the side surface of the thermal conduction member for heat absorption lies on a plane that is substantially parallel to a longitudinal axis of the lead.

12. The photoelectric conversion module with a cooling function according to claim 1, wherein:
    the thermal conduction member for heat absorption is disposed on an upper surface of the peltiert element; and
    the thermal conduction member for heat release is disposed on a lower surface of the peltiert element.

13. The photoelectric conversion module with a cooling function according to claim 1, further comprising a photo diode monitor, wherein the device adapted to transmit or to receive an optical signal is not attached to a surface that is contiguous with a surface on which the photo diode monitor is mounted.

14. The photoelectric conversion module with a cooling function according to claim 1, wherein, with respect to a direction normal to a direction in which the thermal conduction member for heat absorption is aligned with the thermal conduction member for heat release, the peltiert element is disposed between the thermal conduction member for heat absorption and the thermal conduction member for heat release.

15. The photoelectric conversion module with a cooling function according to claim 13, wherein, with respect to a direction normal to a direction in which the thermal conduction member for heat absorption is aligned with the thermal conduction member for heat release, the peltiert element is disposed between the photo diode monitor and the device adapted to transmit or to receive an optical signal.

16. A photoelectric conversion module with a cooling function, comprising:
    a device adapted to transmit or to receive an optical signal;

a stem to fix the device adapted to transmit or to receive an optical signal;

a cap to cover the device adapted to transmit or to receive an optical signal;

a lead to apply an electrical signal to the device adapted to transmit or to receive an optical signal or to transmit an electrical signal from the device adapted to transmit or to receive an optical signal, and a heat releasing device disposed on the stem, wherein the heat releasing device comprises:
- a peltiert element;
- a thermal conduction member for heat absorption disposed on one side of the peltiert element; and
- a thermal conduction member for heat release disposed on another side of the peltiert element, wherein the device adapted to transmit or to receive an optical signal is disposed on a side surface of the thermal conduction member for heat absorption through a sub-mount.

17. The photoelectric conversion module with a cooling function according to claim 16, wherein:

the sub-mount is disposed on an upper surface of the thermal conduction member for heat absorption.

18. The photoelectric conversion module with a cooling function according to claim 17, wherein:

the device adapted to transmit or to receive an optical signal is disposed on a side of the sub-mount.

* * * * *